(12) United States Patent
Guo et al.

(10) Patent No.: US 9,721,531 B2
(45) Date of Patent: Aug. 1, 2017

(54) PIXEL ARRANGEMENT STRUCTURE, DISPLAY DEVICE AND DISPLAY METHOD

(71) Applicants: Boe Technology Group Co., Ltd., Beijing (CN); Beijing Boe Optoelectronics Technology Co., Ltd., Beijing (CN)

(72) Inventors: Renwei Guo, Beijing (CN); Xue Dong, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 8 days.

(21) Appl. No.: 14/905,303

(22) PCT Filed: Aug. 13, 2015

(86) PCT No.: PCT/CN2015/086865
§ 371 (c)(1),
(2) Date: Jan. 15, 2016

(87) PCT Pub. No.: WO2016/145776
PCT Pub. Date: Sep. 22, 2016

(65) Prior Publication Data
US 2017/0110086 A1    Apr. 20, 2017

(30) Foreign Application Priority Data
Mar. 18, 2015    (CN) .......................... 2015 1 0121608

(51) Int. Cl.
*G09G 5/02* (2006.01)
(52) U.S. Cl.
CPC ....... *G09G 5/02* (2013.01); *G09G 2300/0452* (2013.01); *G09G 2320/0242* (2013.01)

(58) Field of Classification Search
CPC ............. G09G 5/02; G09G 2300/0439; G09G 2300/0443; G09G 2300/0452;
(Continued)

(56) References Cited

U.S. PATENT DOCUMENTS

| 5,311,337 A | 5/1994 | McCartney, Jr. |
| 6,914,649 B2 * | 7/2005 | Liu ................... G02F 1/133514 345/694 |

(Continued)

FOREIGN PATENT DOCUMENTS

| CN | 101653012 A | 2/2010 |
| CN | 103777393 | 5/2014 |

(Continued)

OTHER PUBLICATIONS

Office Action from CN Application No. 201510121608.4 dated Aug. 29, 2016.
(Continued)

*Primary Examiner* — Tom Sheng
(74) *Attorney, Agent, or Firm* — Calfee, Halter & Griswold LLP

(57) ABSTRACT

The disclosure provides a pixel arrangement structure, a display device and a display method. The pixel arrangement structure comprises at least one pixel unit arranged in parallel along the longitudinal direction, each pixel unit comprising first pixels and second pixels arranged alternately along the horizontal direction; each first pixel comprising a first sub-pixel and a second sub-pixel arranged in turn in a first row along the horizontal direction and a third sub-pixel in a second row along the horizontal direction; each second pixel comprising a third sub-pixel in the first row along the horizontal direction and a first sub-pixel and a second sub-pixel arranged in turn in the second row along the horizontal direction, sub-pixels located in the first row (Continued)

inclining towards a first direction, sub-pixels located in the second row inclining towards a second direction, wherein the first direction and the second direction are horizontally opposite.

21 Claims, 7 Drawing Sheets

(58) Field of Classification Search
CPC .......... G09G 2320/0242; G09G 3/3607; H01L 27/3211; H01L 27/3213; H01L 27/3216; H01L 27/3218; G02F 2001/134345
See application file for complete search history.

(56) References Cited

U.S. PATENT DOCUMENTS

| | | | |
|---|---|---|---|
| 7,701,476 B2* | 4/2010 | Brown Elliott ... | G02F 1/133514 345/204 |
| 9,164,285 B2* | 10/2015 | Whangbo .......... | G02B 27/2214 |
| 2005/0122294 A1* | 6/2005 | Ben-David ......... | G09G 3/2003 345/87 |
| 2005/0140893 A1 | 6/2005 | Hong | |
| 2011/0043533 A1* | 2/2011 | Han ........................ | G09G 5/02 345/589 |
| 2011/0043553 A1* | 2/2011 | Brown Elliott ...... | G09G 3/3406 345/694 |
| 2015/0014662 A1 | 1/2015 | Huang et al. | |
| 2015/0029208 A1* | 1/2015 | Kim ..................... | G09G 3/2003 345/590 |
| 2015/0138473 A1* | 5/2015 | Zhang ............... | G02F 1/134309 349/43 |
| 2015/0379916 A1* | 12/2015 | Guo .................. | G02F 1/136286 345/694 |
| 2015/0380471 A1* | 12/2015 | Guo ........................ | G09G 3/20 345/76 |
| 2016/0035305 A1* | 2/2016 | Jin ...................... | G02F 1/13454 345/205 |
| 2016/0217726 A1* | 7/2016 | Guo .................... | G09G 3/2003 |

FOREIGN PATENT DOCUMENTS

| | | |
|---|---|---|
| CN | 104037201 | 9/2014 |
| CN | 104050889 | 9/2014 |
| CN | 104112763 A | 10/2014 |
| CN | 203931380 | 11/2014 |
| CN | 104597675 A | 5/2015 |
| CN | 104658433 | 5/2015 |
| JP | 2014026010 A | 2/2014 |

OTHER PUBLICATIONS

International Search Report and Written Opinion from PCT/CN2015/086865 dated Nov. 17, 2015.
Office action from Chinese Application No. 201510121608.4 dated Mar. 13, 2017.

* cited by examiner

PIXEL ARRANGEMENT STRUCTURE, DISPLAY DEVICE AND DISPLAY METHOD

RELATED APPLICATIONS

The present application is the U.S. national phase entry of PCT/CN2015/086865, with an international filing date of Aug. 13, 2015, which claims the benefit of Chinese Patent Application No. 201510121608.4, filed on Mar. 18, 2015, the entire disclosures of which are incorporated herein by reference.

FIELD OF THE INVENTION

The present invention relates to the field of display technology, particularly to a pixel arrangement structure, a display device and a display method.

BACKGROUND OF THE INVENTION

Displays have been widely used by various electronic devices such as: mobile phones, Personal Digital Assistants (PDA), digital cameras, computers or laptops, and high resolution of the display has gradually become one of the important performances of various electronic devices.

The common pixel design of the conventional display is using three sub-pixels: red, green, and blue (RGB) sub-pixels to constitute one pixel. A plurality of the above pixels are arranged in the form of a matrix. When the user views the display, the visual resolution thereof is namely the physical resolution of the display (actual resolution). Hence, in order to improve the display effect of the display, the design of improving pixels per inch (PPI) of the image has to be used in the process of manufacturing the display, i.e., increasing the pixel number in each inch. However, with the increase of the feeling requirement of the user to the display screen, the current manufacturing process of the display panel has reached the limit. In order to improve the display effect in the event that the size of the sub-pixel is fixed, the prior art proposes a display device of Pen tile mode. The pixel array in this display device is as shown in FIG. 1, the sub-pixels 11 of the odd rows are arranged according to the order of R, G, B in sequence, and the sub-pixels 12 of the even rows are arranged according to the order of B, R, G in sequence. In the process of display, a sampling area is arranged on the pixel arrangement structure, a plurality of red sub-pixels, green sub-pixels and/or blue sub-pixels to which the sampling area corresponds are shared, so as to realize a higher resolution than the actual resolution in visual effect. However, in the display device of the Pen tile mode, since the sub-pixels in the pixel array are arranged in a single direction, the colors in certain directions are not uniform, thereby influencing the display effect of the display panel.

SUMMARY OF THE INVENTION

The embodiment of the present invention provides a pixel arrangement structure, a display device and a display method, for improving display effect of the display panel.

A first aspect of the present invention provides a pixel arrangement structure, comprising at least one pixel unit arranged in parallel along a longitudinal direction, each pixel unit comprising first pixels and second pixels arranged alternately along a horizontal direction.

Each first pixel comprises a first sub-pixel and a second sub-pixel arranged in turn in a first row along the horizontal direction and a third sub-pixel in a second row along the horizontal direction, each second pixel comprising a third sub-pixel in the first row along the horizontal direction and a first sub-pixel and a second sub-pixel arranged in turn in the second row along the horizontal direction.

Sub-pixels located in the first row incline towards a first direction, sub-pixels located in the second row incline towards a second direction, wherein the first direction and the second direction are horizontally opposite.

A shape of each sub-pixel located in the first row may be a first parallelogram, a shape of each sub-pixel located in the second row may be a second parallelogram which is a mirror image of the first parallelogram.

Longitudinal projections of two adjacent base edges of the first parallelogram and the second parallelogram may not coincide.

In the two adjacent base edges of the first parallelogram and the second parallelogram, a longitudinal projection of an endpoint of the base edge of the first parallelogram can be located at a midpoint of a longitudinal projection of the base edge of the second parallelogram; or a longitudinal projection of an endpoint of the base edge of the second parallelogram can be located at a midpoint of a longitudinal projection of the base edge of the first parallelogram.

A preset number of sub-pixels can be comprised within a unit pixel area, the preset number includes any one of: 2, 1.5 and 1.

Acute angles within the first parallelogram and the second parallelogram can be between 70~90 degrees.

Acute angles within the first parallelogram and the second parallelogram can be 82~85 degrees.

The first sub-pixels can be red, the second sub-pixels can be green, and the third sub-pixels can be blue.

A second aspect of the present invention provides a display device comprising any of the above pixel arrangement structure.

A third aspect of the present invention provides a display method for the above display device, the method comprising:

receiving an image signal and performing data processing to the received image signal;

arranging at least one sampling area in the pixel arrangement structure of the display device based on the data processing result;

sharing at least one of the first sub-pixels, the second sub-pixels and the third sub-pixels to which the sampling areas correspond to output a pixel-shared display signal; and displaying the image signal based on the pixel-shared display signal.

A shape of the sampling area can be a diamond.

The sampling area can comprise at least one part of at least one sub-pixel in the first sub-pixels, the second sub-pixels and the third sub-pixels.

the step of sharing at least one of the first sub-pixels, the second sub-pixels and the third sub-pixels to which the sampling areas correspond to output a pixel-shared display signal may comprise: outputting a main display signal through main sub-pixels of the sampling area, and outputting a shared display signal through auxiliary sub-pixels of the sampling area, wherein the main sub-pixels are sub-pixels in the first sub-pixels, the second sub-pixels and the third sub-pixels that are entirely contained in the sampling area, the auxiliary sub-pixels are sub-pixels in the first sub-pixels, the second sub-pixels and the third sub-pixels that are partly contained in the sampling area, and the shared display signal is a proportioning signal of the main display signal.

The main sub-pixels can be red, the auxiliary sub-pixels can be green and blue; or the main sub-pixels can be green, the auxiliary sub-pixels can be red and blue; or the main sub-pixels can be blue, the auxiliary sub-pixels can be red and green.

In the pixel arrangement structure, the display device and the display method provided by the embodiment of the present invention, because the sub-pixels located in the first row incline towards a first direction, the sub-pixels located the second row incline towards a second direction, wherein the first direction and the second direction are horizontally opposite, the sub-pixels located in the first row and the sub-pixels located in the second row can perform light compensation mutually in the light exit direction. In this way, the pixel arrangement structure can avoid colors in certain directions being nonuniform, thereby being capable of improving display effect of the display panel.

BRIEF DESCRIPTION OF THE DRAWINGS

In order to explain the technical solutions of the embodiments of the present invention more clearly, the drawings to be used in the description of the embodiments or the prior art will be introduced briefly next. As is apparent from the drawings described below only some embodiments of the present invention are described in detail. However, for the ordinary skilled person in the art, without significant experimentation, may create other drawings that fall within the scope of the present invention.

DETAILED DESCRIPTION OF THE INVENTION

Next, the technical solutions in the embodiments of the present invention will be described clearly and completely with reference to the drawings in the embodiments of the present invention. The embodiments described are only a part of rather than all of the embodiments of the present invention. Based on the embodiments in the present invention, all of the other embodiments obtained by the ordinary skilled person in the art without paying any creative work belong to the protection and scope of the present invention.

It should be explained that the row and the column in the embodiments of the present invention are only relative concepts. The row described in the embodiments of the present invention is explained by taking the horizontal direction as the example, i.e., the horizontal direction as stated in the present application. The column is explained by taking the vertical direction as the example (i.e., the longitudinal direction as stated in the present application). However, since the pixels are arranged in the matrix form, when the viewing direction is different, the row and the column can be interchanged, and the horizontal direction and the longitudinal direction can also be interchange, without affecting the description of the present invention.

Figure 2:
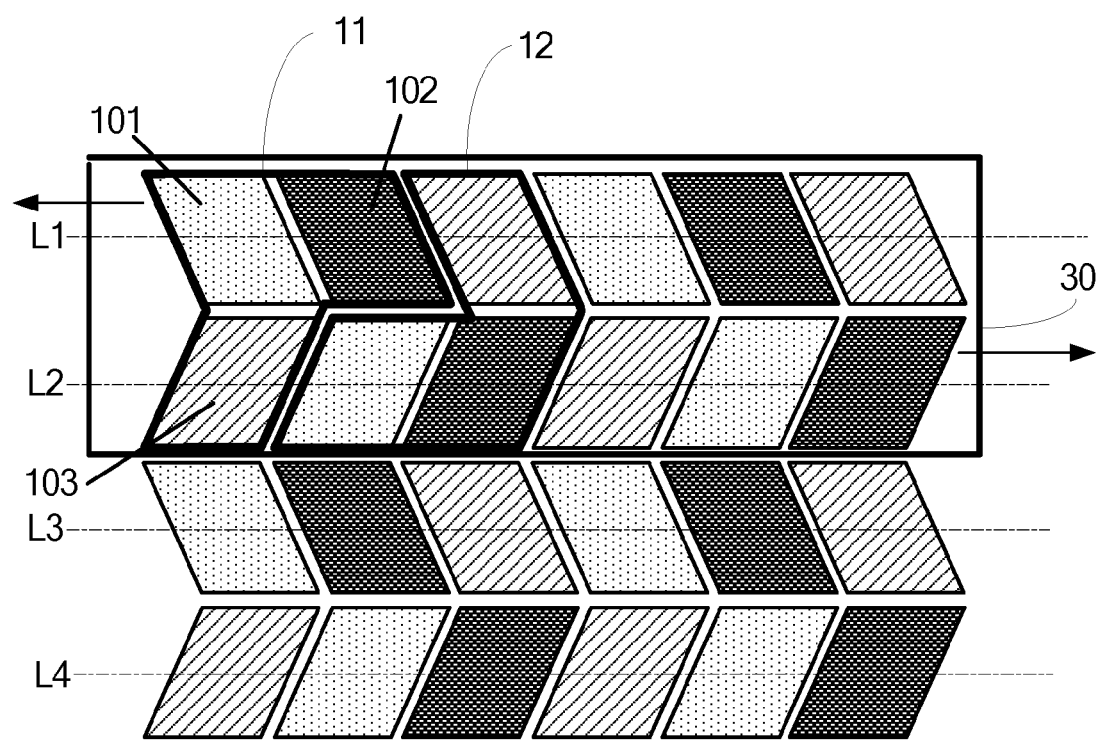
FIG. 2 is a schematic view of a pixel arrangement structure provided by an embodiment of the present invention.

FIG. 2 is a schematic view of a pixel arrangement structure provided by an embodiment of the present invention. As shown in FIG. 2, the pixel arrangement structure comprises at least one pixel unit 30 arranged in parallel along the longitudinal direction, each pixel unit 30 comprising first pixels 11 and second pixels 12 arranged alternately along the horizontal direction.

Figure 3:
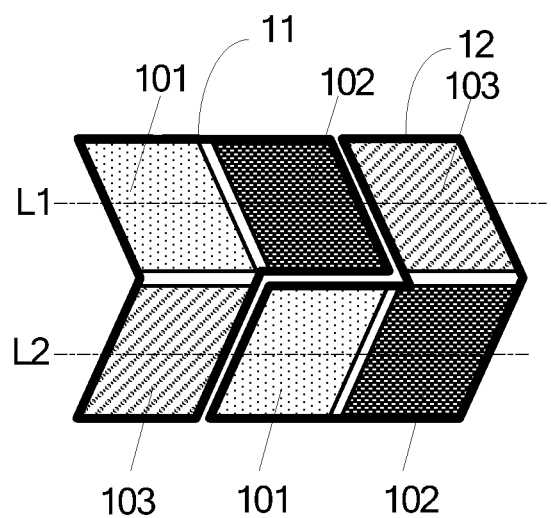
FIG. 3 is a schematic view of first pixels and second pixels of the pixel arrangement structure as shown in FIG. 2.

FIG. 3 is a schematic view of first pixels 11 and second pixels 12 of the pixel arrangement structure as shown in FIG. 2. As shown in FIG. 3, each first pixel 11 comprises a first sub-pixel 101 and a second sub-pixel 102 arranged in turn in a first row L1 along the horizontal direction and a third sub-pixel 103 in a second row L2 along the horizontal direction. Each second pixel 12 comprises a third sub-pixel 103 in the first row L1 along the horizontal direction and a first sub-pixel 101 and a second sub-pixel 102 arranged in turn in the second row L2 along the horizontal direction.

Sub-pixels located in the first row L1 incline towards a first direction (which is shown with a left arrow in FIG. 2). Sub-pixels located in the second row L2 incline towards a second direction (which is shown in a right arrow in FIG. 2), wherein the first direction and the second direction are horizontally opposite.

Although, in both FIGS. 2 and 3, explanations are made by taking the example that the shape of the sub-pixels located in the first row is a parallelogram inclining towards left and the shape of the sub-pixels located in the second row is a parallelogram inclining towards right, it is only one manner for implementing the embodiment of the present invention that the shape of the sub-pixels located in the first row is a parallelogram inclining towards left and the shape of the sub-pixels located in the second row is a parallelogram inclining towards right, which do not serve as limitations to the present invention (i.e., first row parallelograms inclining to the right and second row parallelograms inclining to the left).

The above first sub-pixel 101 and second sub-pixel 102 located in the first row L1 specifically means that the first sub-pixel 101 and the second sub-pixel 102 are arranged in turn along the horizontal direction to form the first row L1 (i.e., the central line of the first row L1 is located at the connecting line of the center points of the first sub-pixel 101 and the second sub-pixel 102). Hence, in FIG. 2, for the upper first pixel unit, the first row is L1, the second row is L2. For the lower second pixel unit, the first row is L3, the second row is L4. Therefore, generally, for the nth pixel unit, the first row is L2n−1, the second row is L2n, wherein n is an integer. The arrangement manner of the sub-pixels in the first row L2n−1 of the nth pixel unit is same as the arrangement manner of the sub-pixels in the first row L1 of the first pixel unit, the arrangement manner of the sub-pixels in the second row L2n of the nth pixel unit is same as the arrangement manner of the sub-pixels in the second row L2 of the first pixel unit.

In the pixel arrangement structure provided by the embodiment of the present invention, because the sub-pixels located in the first row incline towards a first direction, the sub-pixels located the second row incline towards a second direction, wherein the first direction and the second direction are horizontally opposite. The sub-pixels located in the first row and the sub-pixels located in the second row can compensate each other in the light exit direction. In this way, the pixel arrangement structure can avoid colors in certain directions being non-uniform, thereby being capable of improving display effect of the display panel.

Figure 4:
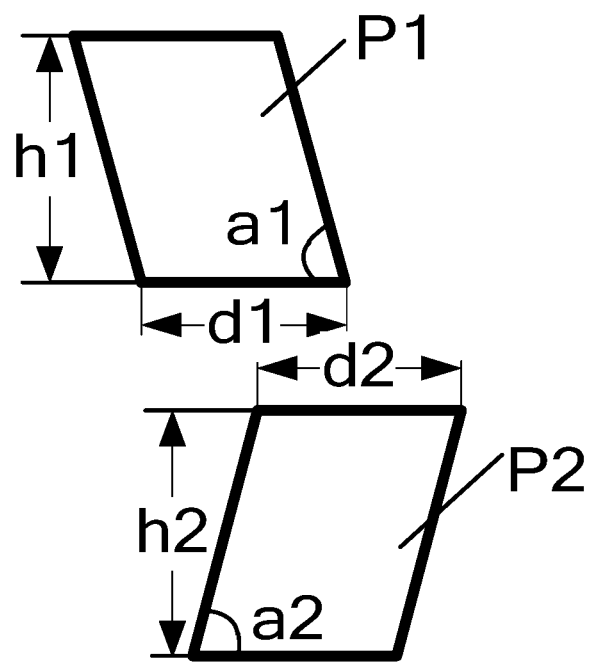
FIG. 4 is a schematic view of shapes of sub-pixels located in the first row and the second row in a pixel unit provided by an embodiment of the present invention.

FIG. 4 is a schematic view of shapes of sub-pixels located in the first row and the second row in a pixel unit provided by an embodiment of the present invention. As shown in FIG. 4, for each pixel unit 30, the shape of the sub-pixels located in the first row can be a first parallelogram P1, the shape of the sub-pixels located in the second row can be a second parallelogram P2 which is a mirror image of the first parallelogram P1.

In an embodiment of the present invention, the shape of the first sub-pixel, the second sub-pixel in the first pixel and the third sub-pixel in the second pixel is the first parallelogram, and the shape of the third sub-pixel in the first pixel and the first sub-pixel and the second sub-pixel in the second pixel is a second parallelogram.

In an embodiment of the present invention, being a mirror image of each other, the height h1 of the first parallelogram P1 is equal to the height h2 of the second parallelogram P2, the length of the lower base edge d1 of the first parallelogram P1 is equal to the length of the upper base edge d2 of the second parallelogram P2, the acute angle a1 within the first parallelogram P1 is same as the acute angle a2 within the second parallelogram P2, and the inclining direction of the opposite sides of the first parallelogram P1 is opposite to the inclining direction of the opposite sides of the second parallelogram P2.

In the above embodiment, the shape of the sub-pixels located in the first row is the first parallelogram, the shape of the sub-pixels located in the second row is the second parallelogram, and the inclining directions of the first parallelogram and the second parallelogram are opposite. Because the inclining directions of the first parallelogram and the second parallelogram are opposite, the sub-pixels located in the first row and the sub-pixels located in the second row can compensate each other in the light exit direction. In this way, the pixel arrangement structure can avoid colors in certain directions being non-uniform, thereby being capable of improving display effect of the display panel.

In the above, the embodiment of a pixel arrangement structure in which the sub-pixels located in the first row and the sub-pixels located in the second row are aligned in the longitudinal direction is described with reference to FIG. 2 to FIG. 4. Next, the embodiment of a pixel arrangement structure in which the sub-pixels located in the first row and the sub-pixels located in the second row are not aligned in the longitudinal direction will be introduced with reference to FIG. 5 and FIG. 6.

Figure 5:
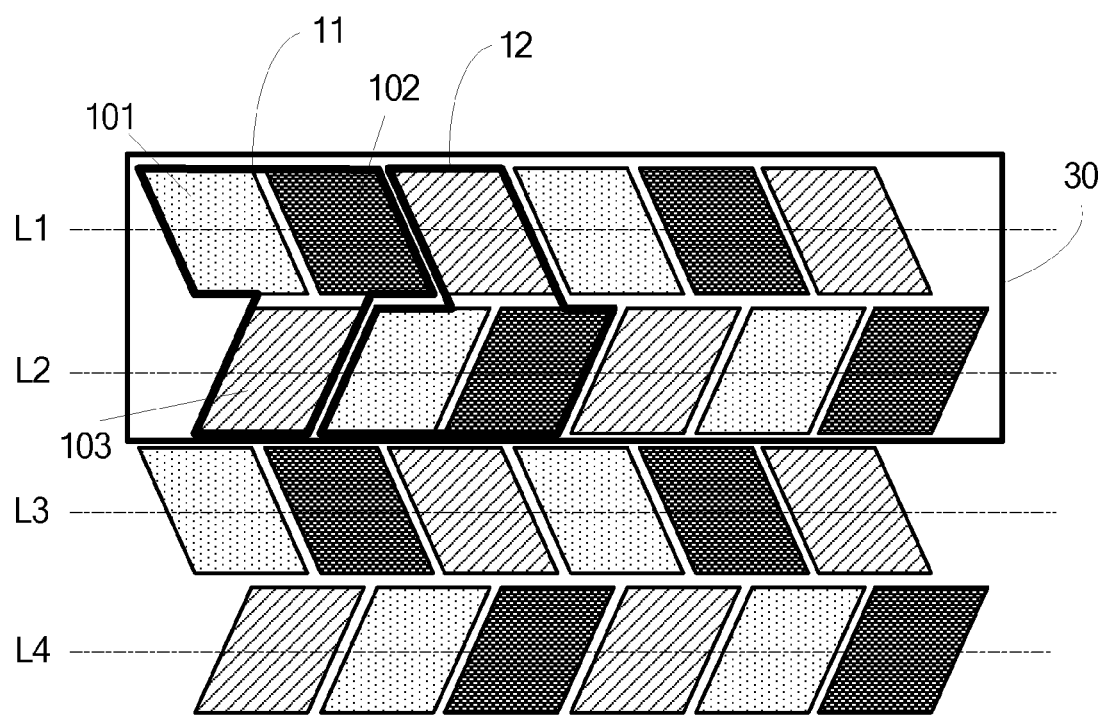
FIG. 5 is a schematic view of a pixel arrangement structure provided by another embodiment of the present invention.

FIG. 5 is a schematic view of a pixel arrangement structure provided by another embodiment of the present invention. In this pixel arrangement structure, for each pixel unit 30, the longitudinal projections (T1, T2) of two adjacent base edges of the sub-pixels located in the first row (the first parallelogram P1) and the sub-pixels located in the second row (the second parallelogram P2) do not coincide.

Figure 6:
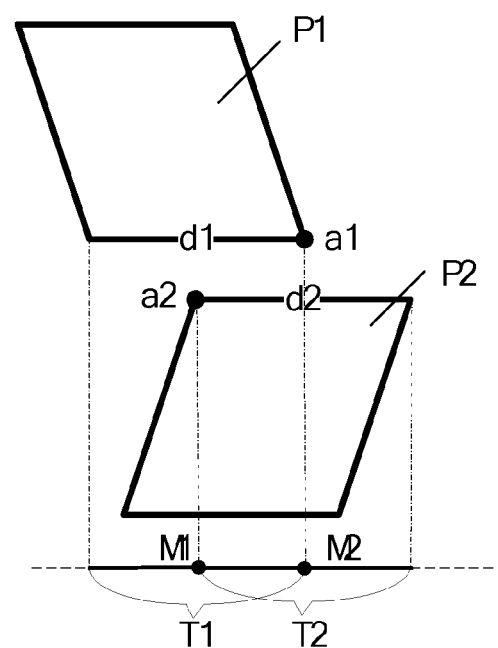
FIG. 6 is a schematic view of a position relationship between the sub-pixels located in the first row and the second row in a pixel unit of the pixel arrangement structure as shown in FIG. 5.

FIG. 6 is a schematic view of a position relationship between the sub-pixels located in the first row and the second row in a pixel unit of the pixel arrangement structure as shown in FIG. 5. FIG. 6 illustrates the embodiment wherein the two adjacent base edges of the first parallelogram P1 and the second parallelogram P2 are the lower base edge d1 of the first parallelogram P1 and the upper base edge d2 of the second parallelogram P2 respectively. As shown in FIG. 6, the lower base edge d1 of the first parallelogram P1 and the upper base edge d2 of the second parallelogram P2 are not entirely aligned in the longitudinal direction.

In the embodiment as shown in FIG. 6, in the two adjacent base edges d1 and d2 of the first parallelogram P1 and the second parallelogram P2, the longitudinal projection of an endpoint a1 of the lower base edge d1 of the first parallelogram P1 can be located at a midpoint M2 of the longitudinal projection of the upper base edge d2 of the second parallelogram P2. Alternatively, the longitudinal projection of an endpoint a2 of the upper base edge d2 of the second parallelogram P2 can be located at a midpoint M1 of the longitudinal projection of the lower base edge d1 of the first parallelogram P1.

In the above embodiment, the shapes of the first parallelogram and the second parallelogram are mirror images of each other, so the height, the width and the inclining angle of the first parallelogram and the second parallelogram are same. Since the longitudinal projections of the adjacent two base edges of the first parallelogram and the second parallelogram do not coincide, as opposed to what is shown in the prior art, the distribution of the sub-pixels within the sampling areas is more uniform when the sampling areas are arranged on the pixel arrangement structure in the display process. Hence, the embodiment of the present invention can further improve the display effect of the display panel.

Figure 7:
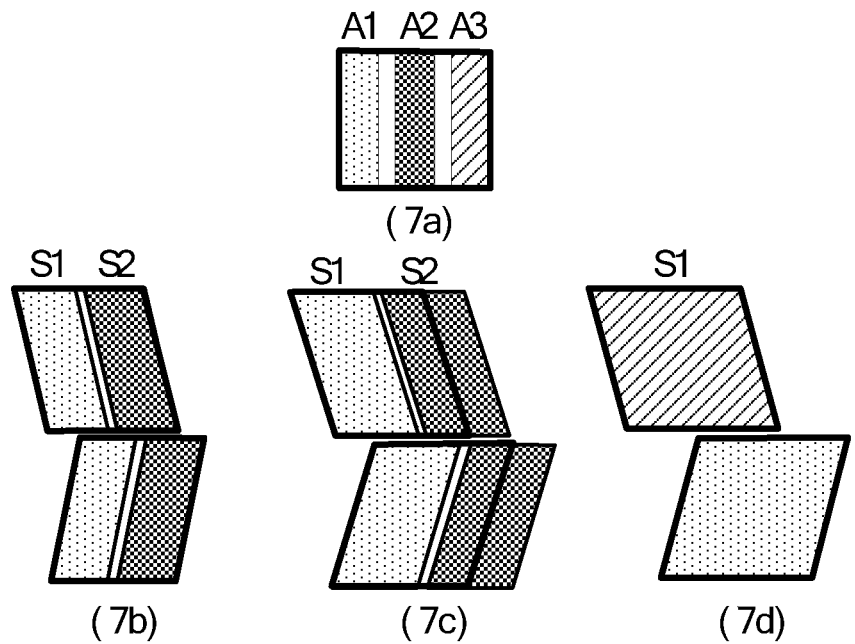
FIG. 7a to FIG. 7d are schematic views of a unit pixel area and the number of sub-pixels comprised in the unit pixel area for different sub-pixel areas provided by an embodiment of the present invention.

FIG. 7a shows a unit pixel area of an embodiment of the present invention. As shown in FIG. 7a, the pixel area of a pixel consisting of the conventional three sub-pixels of R, G, B forms a unit pixel area. Certainly, the unit pixel area is a relative area, when the area of the three sub-pixels R, G, B as the reference becomes larger, the unit pixel area will also become larger correspondingly. Each sub-pixel in the unit pixel area is controlled by a data line, and three data lines are required to control the unit pixel area.

FIGS. 7b to 7d are schematic views of the number of sub-pixels comprised in a unit pixel area for different sub-pixel areas. As shown in FIGS. 7b to 7d, a preset number of sub-pixels can be comprised within the unit pixel area, the preset number can include any one of: 2, 1.5 and 1.

Figure 1:
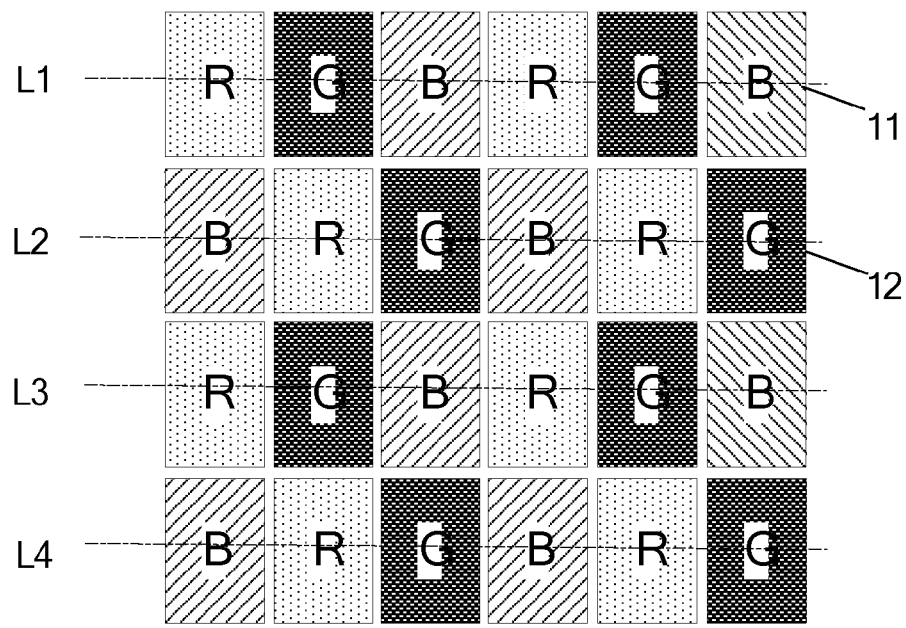
FIG. 1 is a schematic view of a pixel arrangement structure in the prior art.

For example, in the embodiment as shown in FIG. 7b, the sub-pixel area is 1.5 times of the sub-pixel area in FIG. 7a, 2 sub-pixels are comprised within the unit pixel area, i.e., the preset number is 2. In the embodiment as shown in FIG. 7c, the sub-pixel area is 2 times of the sub-pixel area in FIG. 7a, 1.5 sub-pixels are comprised within the unit pixel area, i.e., the preset number is 1.5. In the embodiment as shown in FIG. 7d, the sub-pixel area is 3 times of the sub-pixel area in FIG. 7a, 1 sub-pixel is comprised within the unit pixel area, i.e., the present number is 1.

Figure 8:
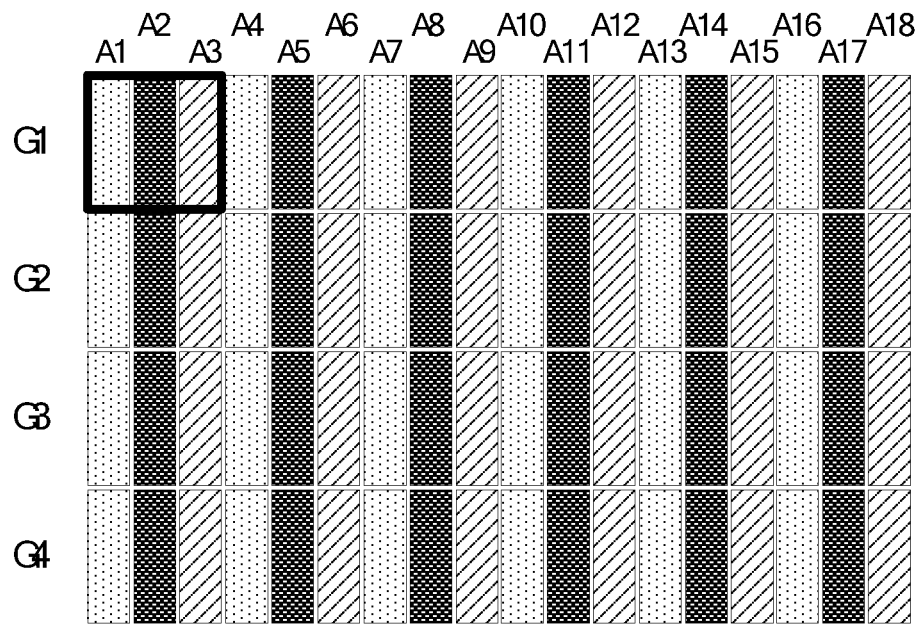
FIG. 8 is a schematic view of a pixel arrangement structure comprising three sub-pixels within a unit pixel area in the prior art.

FIG. 8 is a schematic view of a pixel arrangement structure comprising 3 sub-pixels within a unit pixel area in the prior art. As shown in FIG. 8, FIG. 8 corresponds to the pixel arrangement manner of 7a in FIG. 7. The sub-pixel in this pixel arrangement structure is a rectangle, three sub-pixels in horizontal arrangement are comprised within the unit pixel area. The three sub-pixels are located in column A1, column A2, and column A3 respectively, and controlled by three data lines that control the column A1, column A2 and column A3.

Figure 9:
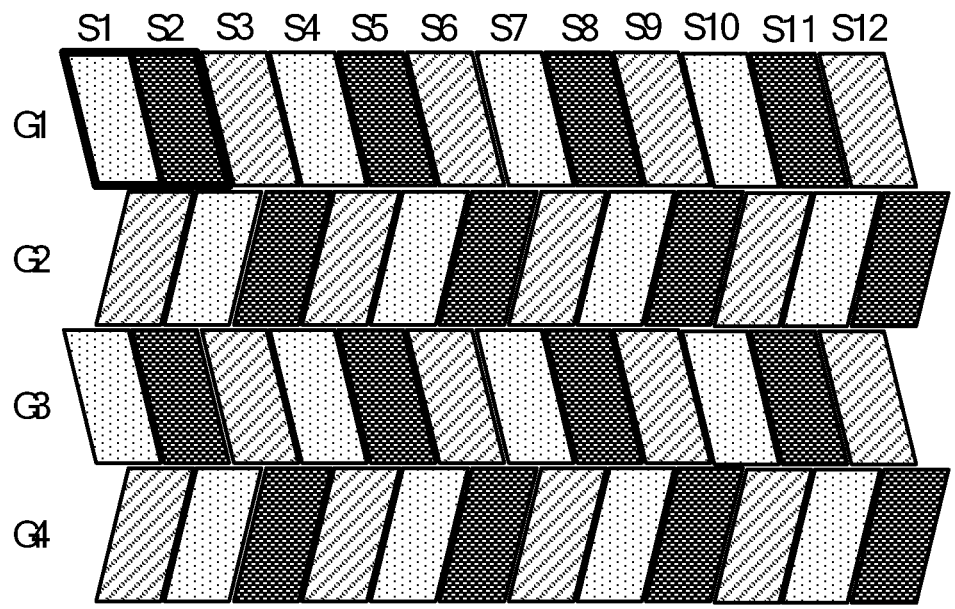
FIG. 9 is a schematic view of a pixel arrangement structure comprising two sub-pixels within a unit pixel area provided by an embodiment of the present invention.

FIG. 9 is a schematic view of a pixel arrangement structure comprising 2 sub-pixels within a unit pixel area provided by an embodiment of the present invention. As shown in FIG. 9, FIG. 9 corresponds to the pixel arrangement manner of 7b in FIG. 7, which is a pixel arrangement structure of the embodiment of the present invention, the sub-pixel in this pixel arrangement structure is a parallelogram. Two sub-pixels in horizontal arrangement are comprised within the unit pixel area. The two sub-pixels are located in column S1 and column S2 respectively, and controlled by two data lines that control the column S1 and column S2. By sharing part of the sub-pixels in the pixel array, the display effect that can be achieved by the pixel arrangement structure as shown in FIG. 9 is equivalent to the display effect achieved by the pixel arrangement structure as shown in FIG. 8. However, the sub-pixel area in FIG. 9 is 1.5 times of the sub-pixel area in FIG. 8. The number of the data lines is reduced by ⅓, so the production process of the display panel can be simplified.

Figure 10:
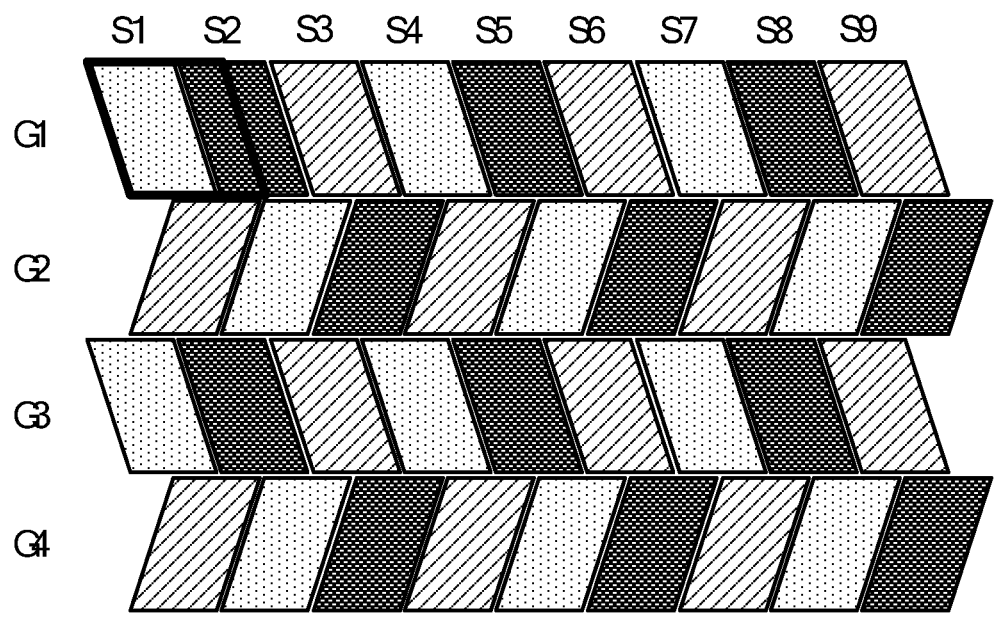
FIG. 10 is a schematic view of a pixel arrangement structure comprising 1.5 sub-pixels within a unit pixel area provided by an embodiment of the present invention.

FIG. 10 is a schematic view of a pixel arrangement structure comprising 1.5 sub-pixels within a unit pixel area provided by an embodiment of the present invention. As shown in FIG. 10, FIG. 10 corresponds to the pixel arrangement manner of 7c in FIG. 7, which is a pixel arrangement structure of the embodiment of the present invention, the sub-pixel in this pixel arrangement structure is a parallelogram. 1.5 sub-pixels in horizontal arrangement are comprised in the unit pixel area. The 1.5 sub-pixels are located at column S1 and the left of column S2, and controlled by data lines that control the column S1 and column S2. The sub-pixel area in FIG. 10 is 2 times of the sub-pixel area in FIG. 8, the number of the data lines is reduced by ½, so the production process of the display panel can be simplified.

Figure 11:
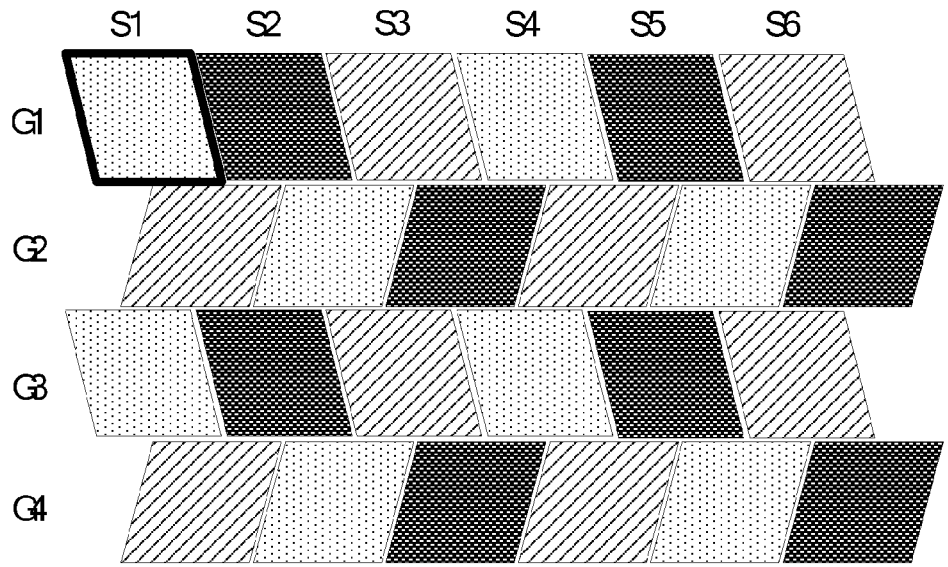
FIG. 11 is a schematic view of a pixel arrangement structure comprising 1 sub-pixel within a unit pixel area provided by an embodiment of the present invention.

FIG. 11 is a schematic view of a pixel arrangement structure comprising 1 sub-pixel within a unit pixel area provided by an embodiment of the present invention. As shown in FIG. 11, FIG. 11 corresponds to the pixel arrangement manner of 7d in FIG. 7, which is a pixel arrangement structure of the embodiment of the present invention, the sub-pixel in this pixel arrangement structure is a parallelogram. 1 sub-pixel is comprised in the unit pixel area. The sub-pixel is located in column S1, and controlled by the data line that controls S1. The sub-pixel area in FIG. 11 is 3 times of the sub-pixel area in FIG. 8, the number of the data lines is reduced by ⅔, so the production process of the display panel can be simplified.

In the above embodiments, the acute angles within the first parallelogram and the second parallelogram can be between 70~90 degrees.

In the above embodiments, the acute angles within the first parallelogram and the second parallelogram can be 82~85 degrees.

In the above embodiments, the first sub-pixel can be red, the second sub-pixel can be green, the third sub-pixel can be blue.

Certainly, the sub-pixels in the above embodiments can also be in other combinations. For example, the first sub-pixel may be red, the second sub-pixel blue, and the third sub-pixel green. Alternatively, the first sub-pixel may be green, the second sub-pixel red, and the third sub-pixel blue. In another alternative, the first sub-pixel may be green, the second sub-pixel blue, and the third sub-pixel red. Alternatively, the first sub-pixel may be blue, the second sub-pixel green, and the third sub-pixel red. Again, alternatively, the first sub-pixel may be blue, the second sub-pixel red, and the third sub-pixel green.

An embodiment of the present invention provides a display device, the display device comprising a pixel arrangement structure as stated in any one of the above embodiments.

In the embodiment of the present invention, the display device can be any product or component with the display function such as: electronic paper, a mobile phone, a panel computer, a television, a display, a laptop, a digital photo frame, and/or a navigator.

In the display device provided by the embodiment of the present invention, each pixel unit comprises first pixels and second pixels arranged alternately along the horizontal direction. Each first pixel comprises a first sub-pixel and a second sub-pixel arranged in turn in a first row along the horizontal direction and a third sub-pixel in a second row along the horizontal direction. Each second pixel comprises a third sub-pixel in the first row along the horizontal direction and a first sub-pixel and a second sub-pixel arranged in turn in the second row along the horizontal direction. Sub-pixels located in the first row incline towards a first direction, sub-pixels located in the second row incline towards a second direction, wherein the first direction and the second direction are horizontally opposite. Hence, the sub-pixels located in the first row and the sub-pixels located in the second row can compensate each other in the light exit direction. In this way, the pixel arrangement structure can avoid colors in certain directions being non-uniform, thereby being capable of improving display effect of the display panel.

Figure 12:
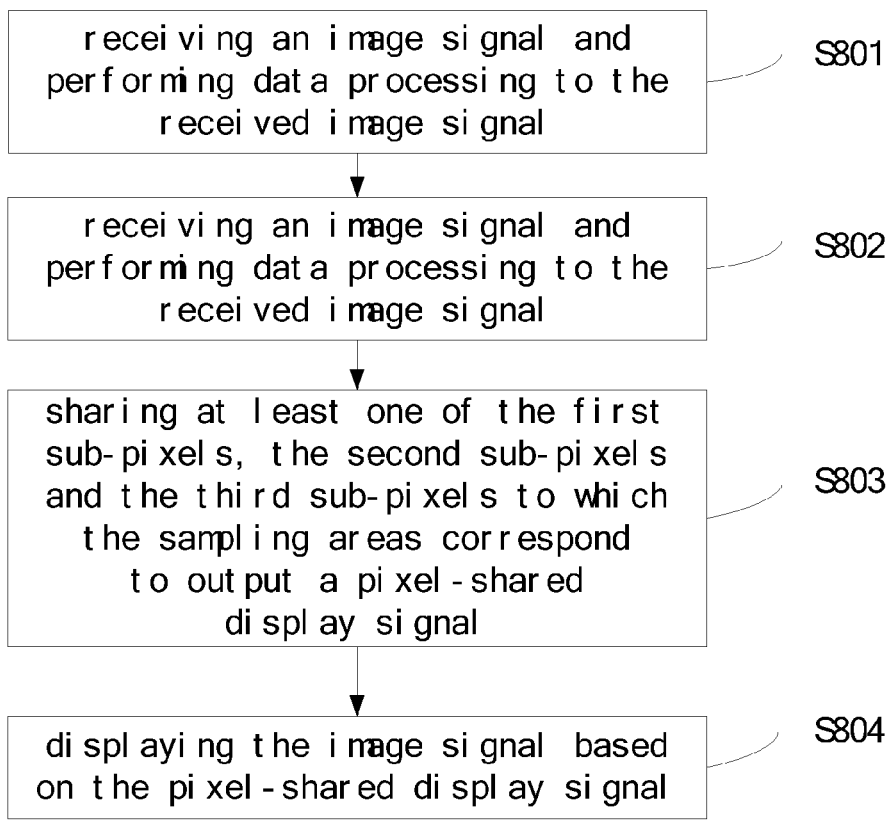
FIG. 12 is a flow chart of a display method provided by an embodiment of the present invention.

FIG. 12 is a flow chart of a display method provided by an embodiment of the present invention. The display method is used for the display devices in the above embodiments. As shown in FIG. 12, the display method comprises the steps of:

S801: receiving an image signal and performing data processing to the received image signal.

S802: arranging at least one sampling area in the pixel arrangement structure of the display device based on the data processing result.

S803: sharing at least one of first sub-pixels, second sub-pixels and third sub-pixels to which the sampling areas correspond to output a pixel-shared display signal.

S804: displaying the image signal based on the pixel-shared display signal.

The above pixel-shared display signal can be divided into a main display signal and a shared signal. The main display signal is a signal outputted by the sub-pixels as a main display in the sampling area. The shared signal is a signal outputted by the sub-pixels as a display other than the above sub-pixels main display in the sampling area. The pixel-shared display signal can be transmitted to the pixel electrode of the display panel. Under the combined action of the pixel electrode and the common electrode, the liquid crystals corresponding to the sampling area are deflected in different directions according to the above main display signal and shared signal, and finally, the image signal is displayed in the display panel.

In the display method provided by the above embodiment, an image signal is first received, and data processing is performed to the received image signal. Then, at least one sampling area is arranged in the pixel arrangement structure of the display device based on the data processing result. Next, the pixel-shared display signal is outputted by sharing at least one of the first sub-pixels, the second sub-pixels, and the third sub-pixels to which the sampling areas correspond. Finally, the image signal is displayed based on the pixel-shared display signal. In the pixel array of the display panel carrying out the above display method, the sub-pixels located in the first row incline towards a first direction, and the sub-pixels located in the second row incline towards a second direction. The first direction and the second direction are horizontally opposite. Hence, the sub-pixels located in the first row and the sub-pixels located in the second row can compensate each other in the light exit direction. In this way, the pixel arrangement structure can avoid colors in certain directions being non-uniform, thereby being capable of improving display effect of the display panel.

Figure 13:
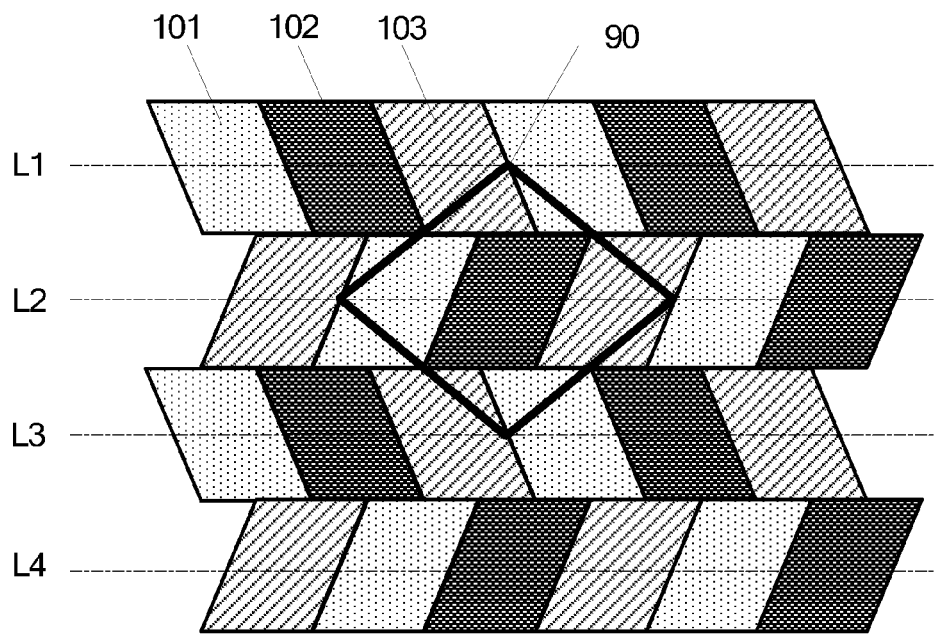
FIG. 13 is a schematic view of a single sampling area provided by an embodiment of the present invention.

FIG. 13 is a schematic view of a single sampling area provided by an embodiment of the present invention. As shown in FIG. 13, the shape of the sampling area can be a diamond. Moreover, the sampling area can comprise at least one part of at least one sub-pixel in the first sub-pixels, the second sub-pixels and the third sub-pixels.

In the embodiment of the present invention, the step of sharing at least one of the first sub-pixels, the second sub-pixels and the third sub-pixels to which the sampling areas correspond to output a pixel-shared display signal can comprise: outputting a main display signal through main sub-pixels of the sampling area, and outputting a shared display signal through auxiliary sub-pixels of the sampling area. The main sub-pixels can be sub-pixels in the first sub-pixels, the second sub-pixels and the third sub-pixels that are entirely contained in the sampling area. The auxiliary sub-pixels can be sub-pixels in the first sub-pixels, the second sub-pixels and the third sub-pixels that are partly contained in the sampling area. The shared display signal is a proportioning signal of the main display signal.

As shown in FIG. 13, the shape of a sampling area 90 can be a diamond. The sampling area 90 comprises an entire second sub-pixel, and the contour boundary of the sampling area 90 is distributed on the three first sub-pixels and three third sub-pixels around the second sub-pixel. That is to say, the sampling area 90 further comprises part of the three first sub-pixels and three third sub-pixels around the second sub-pixel. In such a case, the second sub-pixel that is entirely contained in the sampling area is a main sub-pixel which outputs the main display signal. The sub-pixels partly contained in the sampling area, i.e., the three first sub-pixels and three third sub-pixels on the contour boundary of the sampling area are auxiliary sub-pixels, which output the shared display signal.

Figure 14:
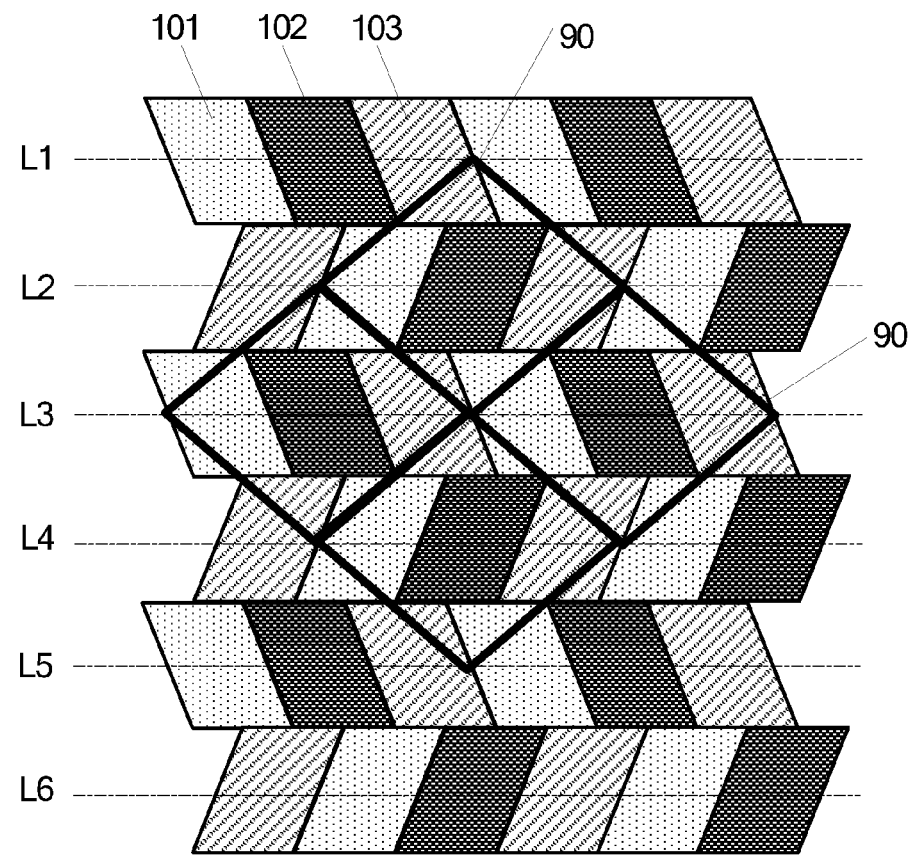
FIG. 14 is a schematic view of a plurality of successive sampling areas provided by an embodiment of the present invention.

FIG. 14 is a schematic view of a plurality of successive sampling area provided by an embodiment of the present invention. As shown in FIG. 14, when in step S802, a plurality of successive sampling areas are arranged in the pixel arrangement structure of the display device based on the data processing result, a plurality of successive diamond sampling areas 90 are arranged as two adjacent sampling areas connecting with each other but not overlapping with each other. In FIG. 14, explanations are made by taking the example of four successive sampling areas and the main sub-pixel being the second sub-pixel. The embodiment of the present invention may further comprise cases of comprising more successive sampling areas and the first sub-pixel or the third sub-pixel being the main sub-pixel, which is similar as the arrangement manner of the sampling areas in FIG. 14.

In the embodiment of the present invention, the shared signal being a proportioning signal of the main display signal specifically means: analyzing and processing the pre-displayed image based on the above image signal (for example, analyzing and processing information such as the image quality, brightness, color of the pre-displayed image), determining the main display signal outputted by the main sub-pixel and obtaining weights of signals inputted to the auxiliary sub-pixels respectively by taking the above main display signal as the reference. The signals with the above weights are proportioning signals. The sum of the weights of the respective proportioning signals is 1.

In the above embodiment, the distribution forms of the main sub-pixels and the auxiliary sub-pixels include the following three: the main sub-pixels are red, the auxiliary sub-pixels are green and blue; or, the main sub-pixels are green, the auxiliary sub-pixels are red and blue; or, the main sub-pixels are blue, the auxiliary sub-pixels are red and green.

What are stated above are only specific embodiments of the present invention, however, the protection scope of the present invention is not limited to this. Any variations or replacements that can be easily conceived by the skilled person familiar with the present technical field should be covered within the protection scope of the present invention. Therefore, the protection scope of the present invention shall be subject to the protection scopes of the claims attached.

The invention claimed is:

1. A pixel arrangement structure, comprising: at least one pixel unit arranged in parallel along a longitudinal direction, each pixel unit comprising one or more first pixels and one or more second pixels arranged alternately along a horizontal direction;
    wherein each first pixel comprises: a first sub-pixel and a second sub-pixel arranged in turn in a first row along the horizontal direction and a third sub-pixel in a second row along the horizontal direction; and
    wherein each second pixel comprises a third sub-pixel in the first row along the horizontal direction and a first sub-pixel and a second sub-pixel arranged in turn in the second row along the horizontal direction; and
    wherein sub-pixels located in the first row incline towards a first direction, and sub-pixels located in the second row incline towards a second direction, the first direction and the second direction being horizontally opposite.

2. The pixel arrangement structure according to claim 1, wherein
    a shape of each sub-pixel located in the first row is a first parallelogram, and a shape of each sub-pixels located in the second row is a second parallelogram that is a mirror image of the first parallelogram.

3. The pixel arrangement structure according to claim 2, wherein
    longitudinal projections of two adjacent base edges of the first parallelogram and the second parallelogram do not coincide.

4. The pixel arrangement structure according to claim 3, wherein,
    in the two adjacent base edges of the first parallelogram and the second parallelogram, a longitudinal projection of an endpoint of the base edge of the first parallelogram is located at a midpoint of a longitudinal projection of the base edge of the second parallelogram.

5. The pixel arrangement structure according to claim 1, wherein the pixel arrangement structure comprises a preset number of sub-pixels within a unit pixel area, wherein the preset number includes any one of: 2, 1.5 and 1.

6. The pixel arrangement structure according to claim 1, wherein acute angles within the first parallelogram and the second parallelogram are between 70≅ and 90 degrees.

7. The pixel arrangement structure according to claim 1, wherein acute angles within the first parallelogram and the second parallelogram are between 82≅ and 85 degrees.

8. The pixel arrangement structure according to claim 1, wherein,
the first sub-pixels are red, the second sub-pixels are green, and the third sub-pixels are blue.

9. A display device, comprising a pixel arrangement structure, the pixel arrangement structure comprising: at least one pixel unit arranged in parallel along a longitudinal direction, wherein each pixel unit comprises one or more first pixels and one or more second pixels arranged alternately along a horizontal direction;
wherein each first pixel comprises a first sub-pixel and a second sub-pixel arranged in turn in a first row along the horizontal direction and a third sub-pixel in a second row along the horizontal direction, wherein each second pixel comprises a third sub-pixel in the first row along the horizontal direction and a first sub-pixel and a second sub-pixel arranged in turn in the second row along the horizontal direction; and
wherein sub-pixels located in the first row incline towards a first direction, sub-pixels located in the second row incline towards a second direction, wherein the first direction and the second direction are horizontally opposite.

10. The display device according to claim 9, wherein,
a shape of each sub-pixel located in the first row is a first parallelogram, a shape of each sub-pixel located in the second row is a second parallelogram that is a mirror image of the first parallelogram.

11. The display device according to claim 10, wherein longitudinal projections of two adjacent base edges of the first parallelogram and the second parallelogram do not coincide.

12. The display device according to claim 11, wherein,
in the two adjacent base edges of the first parallelogram and the second parallelogram, a longitudinal projection of an endpoint of the base edge of the first parallelogram is located at a midpoint of a longitudinal projection of the base edge of the second parallelogram.

13. The display device according to claim 11, wherein,
in the two adjacent base edges of the first parallelogram and the second parallelogram, a longitudinal projection of an endpoint of the base edge of the second parallelogram is located at a midpoint of a longitudinal projection of the base edge of the first parallelogram.

14. The display device according to claim 9, wherein the pixel arrangement structure comprises a preset number of sub-pixels within a unit pixel area, the preset number any one of: 2, 1.5 and 1.

15. The display device according to claim 9, wherein acute angles within the first parallelogram and the second parallelogram are between 70 and 90 degrees.

16. The display device according to claim 9, wherein acute angles within the first parallelogram and the second parallelogram are between 82 and 85 degrees.

17. The display device according to claim 9, wherein,
the first sub-pixels are red, the second sub-pixels are green, and the third sub-pixels are blue.

18. A display method for the display device according to claim 9, comprising:
receiving an image signal and performing data processing to the received image signal;
arranging at least one sampling area in the pixel arrangement structure of the display device based on the data processing result;
sharing at least one of the first sub-pixels, the second sub-pixels and the third sub-pixels to which the sampling areas correspond to output a pixel-shared display signal; and
displaying the image signal based on the pixel-shared display signal.

19. The method according to claim 18, wherein a shape of the sampling area is a diamond.

20. The method according to claim 19, wherein the sampling area comprises at least one part of at least one sub-pixel each of the first sub-pixels, the second sub-pixels and the third sub-pixels; and wherein
the step of sharing at least one of the first sub-pixels, the second sub-pixels, and the third sub-pixels to which the sampling areas correspond to output a pixel-shared display signal comprises: outputting a main display signal through main sub-pixels of the sampling area, and outputting a shared display signal through auxiliary sub-pixels of the sampling area, wherein the main sub-pixels are sub-pixels in the first sub-pixels, the second sub-pixels and the third sub-pixels that are entirely contained in the sampling area, the auxiliary sub-pixels are sub-pixels in the first sub-pixels, the second sub-pixels and the third sub-pixels that are partly contained in the sampling area, and the shared display signal is a proportioning signal of the main display signal.

21. The method according to claim 20, wherein,
the main sub-pixels are red, and the auxiliary sub-pixels are green and blue; or
the main sub-pixels are green, and the auxiliary sub-pixels are red and blue; or
the main sub-pixels are blue, and the auxiliary sub-pixels are red and green.

* * * * *